United States Patent
Honishi et al.

(10) Patent No.: US 11,430,903 B2
(45) Date of Patent: Aug. 30, 2022

(54) MULTI-JUNCTION SOLAR CELL MODULE AND PHOTOVOLTAIC SYSTEM

(71) Applicants: KABUSHIKI KAISHA TOSHIBA, Tokyo (JP); TOSHIBA ENERGY SYSTEMS & SOLUTIONS CORPORATION, Kawasaki (JP)

(72) Inventors: Yuya Honishi, Yokohama Kanagawa (JP); Mutsuki Yamazaki, Yokohama Kanagawa (JP); Soichiro Shibasaki, Tokyo (JP); Sara Yoshio, Yokohama Kanagawa (JP); Naoyuki Nakagawa, Tokyo (JP); Kazushige Yamamoto, Yokohama Kanagawa (JP)

(73) Assignees: KABUSHIKI KAISHA TOSHIBA, Tokyo (JP); TOSHIBA ENERGY SYSTEMS & SOLUTIONS CORPORATION, Kawasaki (JP)

(*) Notice: Subject to any disclaimer, the term of this patent is extended or adjusted under 35 U.S.C. 154(b) by 149 days.

(21) Appl. No.: 16/563,993

(22) Filed: Sep. 9, 2019

(65) Prior Publication Data
US 2020/0035849 A1    Jan. 30, 2020

Related U.S. Application Data

(63) Continuation of application No. PCT/JP2018/011220, filed on Mar. 20, 2018.

(51) Int. Cl.
*H01L 31/0725* (2012.01)
*H01L 31/0224* (2006.01)
(Continued)

(52) U.S. Cl.
CPC .. *H01L 31/0725* (2013.01); *H01L 31/022425* (2013.01); *H01L 31/022466* (2013.01); *H01L 31/074* (2013.01); *H01L 31/0747* (2013.01)

(58) Field of Classification Search
CPC ... H01L 31/0725; H01L 31/074; H01L 31/06; H01L 31/0475; H01L 25/043; H01L 25/042
See application file for complete search history.

(56) References Cited

U.S. PATENT DOCUMENTS 4,016,589 A * 4/1977 Tanimura ............... H01L 27/00
                                                            257/37
4,400,868 A * 8/1983 Antypas ............... H01L 31/043
                                                            136/249
(Continued)

FOREIGN PATENT DOCUMENTS

CN    103715182    4/2014
JP    5-077191    10/1993
(Continued)

OTHER PUBLICATIONS

International Search Report and Written Opinion for International Application No. PCT/JP2018/011220 dated May 22, 2018, 10 pgs.
(Continued)

*Primary Examiner* — Sadie White
(74) *Attorney, Agent, or Firm* — Amin, Turocy & Watson, LLP

(57) ABSTRACT

A multi-junction solar cell module of an embodiment includes: a first solar cell module disposed on a light incident side and including a plurality of first solar cells and a first connection wiring electrically connecting the plurality of the first solar cells; a second solar cell module including a plurality of second solar cells and a second connection wiring electrically connecting the plurality of the second solar cells; and an adhesive layer between the first solar cell module and the second solar cell module.

18 Claims, 9 Drawing Sheets

(51) Int. Cl.
*H01L 31/074* (2012.01)
*H01L 31/0747* (2012.01)

(56) References Cited

U.S. PATENT DOCUMENTS

| | | | | |
|---|---|---|---|---|
| 4,959,106 | A * | 9/1990 | Nakagawa | H01L 31/02963 136/258 |
| 6,264,684 | B1 * | 7/2001 | Banas | A61F 2/82 623/1.13 |
| 2004/0035460 | A1 * | 2/2004 | Gonsiorawski | B32B 17/10816 136/251 |
| 2006/0049027 | A1 * | 3/2006 | Iversen | H01H 39/006 200/61.8 |
| 2007/0045803 | A1 * | 3/2007 | Ye | H01L 24/48 257/686 |
| 2008/0128900 | A1 * | 6/2008 | Leow | H01L 21/6835 257/723 |
| 2009/0108757 | A1 * | 4/2009 | Lee | H01L 51/5281 315/51 |
| 2010/0252103 | A1 * | 10/2010 | Yao | H01L 33/0095 136/256 |
| 2011/0174356 | A1 | 7/2011 | Watanabe et al. | |
| 2011/0186112 | A1 * | 8/2011 | Aernouts | H01L 31/046 136/249 |
| 2012/0180484 | A1 * | 7/2012 | Bak | F24S 70/16 60/641.15 |
| 2012/0285726 | A1 * | 11/2012 | Tokunaga | G03C 1/85 174/126.2 |
| 2013/0284245 | A1 | 10/2013 | Kim et al. | |
| 2013/0307406 | A1 * | 11/2013 | Hosokawa | H05B 33/24 313/504 |
| 2014/0014169 | A1 * | 1/2014 | Rand | H01L 31/035281 136/255 |
| 2014/0060617 | A1 | 3/2014 | Miyashita et al. | |
| 2014/0202515 | A1 * | 7/2014 | Haase | H01L 25/043 136/244 |
| 2015/0083186 | A1 * | 3/2015 | Shibasaki | H01L 31/043 136/244 |
| 2016/0126399 | A1 | 5/2016 | Hino et al. | |
| 2017/0256663 | A1 * | 9/2017 | Matthias | H01L 31/043 |
| 2017/0323993 | A1 * | 11/2017 | Bjork | H01L 31/028 |
| 2020/0056091 | A1 * | 2/2020 | Piquette | C09K 11/02 |

FOREIGN PATENT DOCUMENTS

| | | |
|---|---|---|
| JP | 06-196732 | 7/1994 |
| JP | 09-246236 | 9/1997 |
| JP | 2895213 | 5/1999 |
| JP | 3070790 | 7/2000 |
| JP | 2000-277779 | 10/2000 |
| JP | 3301722 | 7/2002 |
| JP | 3619099 | 2/2005 |
| JP | 2010-062186 | 3/2010 |
| JP | 2010-109227 | 5/2010 |
| JP | 2010-109349 | 5/2010 |
| JP | 2012-238789 | 12/2012 |
| JP | 2013-179297 | 9/2013 |
| JP | 2015-065249 | 4/2015 |
| JP | 5695283 | 4/2015 |
| JP | 2015-154050 | 8/2015 |
| JP | 5769037 | 8/2015 |
| JP | 2016-119401 | 6/2016 |
| JP | 2017-534184 | 11/2017 |

OTHER PUBLICATIONS

Essig, et al. "Realization of GaInP/Si Dual-Junction Solar Cells With 29.8% 1-Sun Efficiency", IEEE Journal of Photovoltaics, vol. 6, No. 4, 2016, pp. 1012-1019.

Gee, et al. "The Potential Performance of GaAs-based Mechanically Stacked, Multijunction Solar Concentrator Cells", Photovoltaic Specialists Conference, 1990, Conference Record of the Twenty First IEEE, 2002, pp. 41-46.

Todorov, et al. "Materials perspectives for next-generation low-cost tandem solar cells", Solar Energy Materials and Solar Cells, 2017, vol. 180, pp. 350-357.

* cited by examiner

MULTI-JUNCTION SOLAR CELL MODULE AND PHOTOVOLTAIC SYSTEM

CROSS-REFERENCE TO RELATED APPLICATION

This application is a continuation application based upon and claims the benefit of priority from International Application PCT/JP2018/011220, the International Filing Date of which is Mar. 20, 2018 the entire contents of which are incorporated herein by reference.

FIELD

Embodiments described herein relate generally to a multi-junction solar cell module and a photovoltaic system.

BACKGROUND

In a non multi-junction solar cell module, a protective glass is used to protect the power generation element of the solar cell module. For example, the protective glass and the power generation element are bonded by an adhesive, but the adhesive deteriorates with long-term use. Deterioration of the adhesive can cause corrosion of the wiring of the solar cell module. Although the deterioration of the adhesive is remarkable under high temperature and humidity conditions, it results in a gradual decrease in power generation in a non multi-junction solar cell module.

In the case of a multi-junction solar cell module, a plurality of solar cell modules are bonded together. If the surface of the solar cell module to be bonded is a substrate such as glass, both modules do not short-circuit even if an adhesive layer to be bonded deteriorates. However, weight reduction is required for a solar cell module. For example, in a multi-junction solar cell in which a solar cell module having a solar cell in which a compound layer having a chalcopyrite structure is used as a light-absorbing layer is used as a top cell and a solar cell module having a solar cell in which Si is used as a light-absorbing layer is used as a bottom cell, if the top cell is a substrate type, the top cell has two substrates. A glass substrate is used as the substrate, and if two substrates are used only in the top cell, the weight of the solar cell module increases. On the other hand, if the top cell is a superstrate type, the number of substrates can be reduced by disposing on the light incident side the substrate used when manufacturing the top cell. However, one of the electrodes of the top cell faces the bottom cell side, and the top cell and the bottom cell are liable to short-circuit due to aging deterioration of the adhesive layer only by bonding with the adhesive layer. If the top cell and the bottom cell short-circuit, the output of the module is greatly reduced, which may cause trouble in the entire device.

DETAILED DESCRIPTION

A multi-junction solar cell module of an embodiment includes: a first solar cell module disposed on a light incident side and including a plurality of first solar cells and a first connection wiring electrically connecting the plurality of the first solar cells; a second solar cell module including a plurality of second solar cells and a second connection wiring electrically connecting the plurality of the second solar cells; and an adhesive layer between the first solar cell module and the second solar cell module. An insulation film is provided on a surface of the second connection wiring facing an adhesive layer so as to be in direct contact with a surface of the adhesive layer facing the second solar cell module, The first solar cell module includes a substrate on a light incident side, and the substrate is a single substrate of the first solar cell module. The second connection wiring is not in direct contact with the adhesive layer.

Multi-Junction Solar Cell Module

Figure 1:
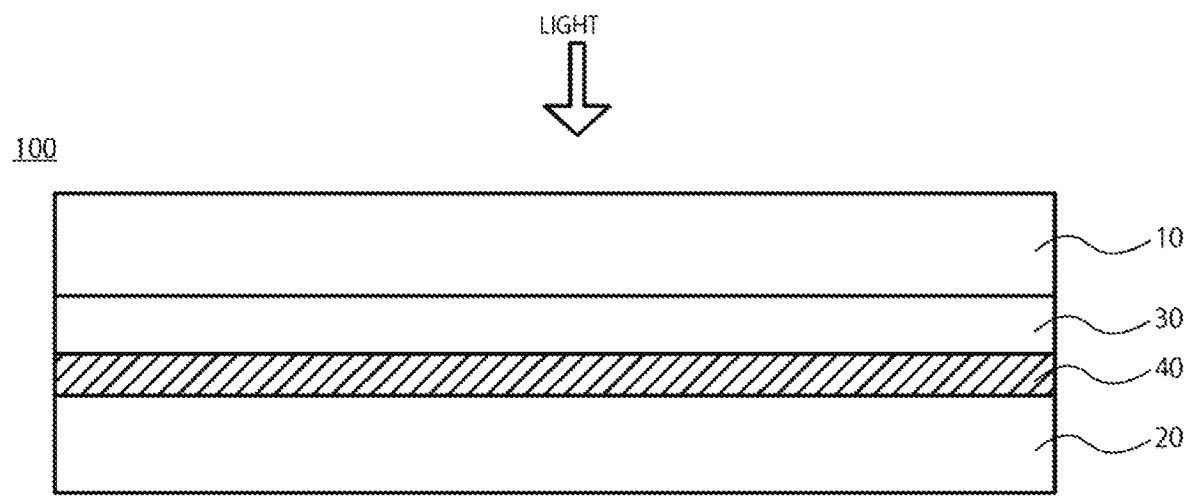
FIG. 1 shows a sectional view of a multi-junction solar cell module.

The junction solar cell module of an embodiment has a first solar cell module and a second solar cell module. FIG. 1 shows a sectional view of the multi-junction solar cell module of the embodiment. A multi-junction solar cell module 100 shown in FIG. 1 has a first solar cell module 10, a second solar cell module 20, an adhesive layer 30, and an insulation film 40. FIG. 1 shows a multi-junction solar cell module in which two solar cell modules are joined together. A multi-junction solar cell module in which three or more solar cell modules are joined is also included in the embodiment.

First Solar Cell Module

The first solar cell module 10 includes a plurality of first solar cells 11. The first solar cell module 10 is disposed on the light incident side in the multi-junction solar cell module 100. The first solar cell module 10 absorbs a part of the incident light to generate electric power. A single substrate of the first solar cell module 10 is disposed on the light incident side of the first solar cell module 10, and a substrate of the first solar cell module 10 is not disposed on the second solar cell module 40 side.

In the first solar cell 11 of the first solar cell module 10, a substrate, a first electrode, a light-absorbing layer, and a second electrode are disposed in this order from the light incident side. An intermediate layer not specified may be included between these layers. The plurality of first solar cells 11 are physically disposed in parallel with the same electrical polarity.

The plurality of first solar cells 11 are electrically connected by a first connection wiring. The plurality of first solar cells 11 are electrically connected in series, in parallel, or in series and parallel. For example, when the first electrode and the second electrode of the adjacent first solar cells 11 are connected and thus the first solar cells 11 are electrically connected in series, the first electrode and the second electrode or the second electrode can constitute the first connection wiring. For example, when the second electrode and the second electrode of the adjacent first solar cells 11 are connected and the first solar cells 11 are electrically connected in parallel, the second electrode can constitute the first connection wiring. When the adjacent first solar cells 11 are electrically connected to each other by a conductive layer other than the first electrode and the second electrode, this conductive layer can constitute the first connection wiring. In the embodiment, the first connection wiring is a conductive member included in the outermost periphery of the conductive members included in the first solar cell 11. The first connection wiring of the first solar cell 11 is disposed at a position closest in distance to a second connection wiring of the second solar cell 21. Another conductive layer includes, for instance, a bus bar.

The band gap of the light-absorbing layer of the first solar cell 11 is preferably wider than the band gap of the light-absorbing layer of the second solar cell 21. The light-absorbing layer of the first solar cell 11 preferably has a wide band gap. Specifically, the band gap of the first solar cell 11 is preferably 1.4 eV or more and 3.0 eV or less.

The light-absorbing layer of the first solar cell 11 is not particularly limited as long as it satisfies the band gap described above. Specifically, the light-absorbing layer of the first solar cell 11 includes one type selected from the group consisting of a copper suboxide thin film, a semiconductor film having a chalcopyrite structure, a semiconductor film having a stannite structure, a semiconductor film having a kieserite structure, an organic thin film, and a perovskite thin film. Examples of the semiconductor film having a chalcopyrite structure include $Cu(In, Ga)(Se, S)_2$, $Cu(In, Ga)Se_2$, $Cu(In, Ga)S_2$, $CuGa(Se, S)_2$, $CuGaSe_2$, and $CuGaS_2$.

The light-absorbing layer of the first solar cell 11 includes a p-type layer and an n-type layer. The first solar cell 11 may be a homojunction solar cell or a heterojunction solar cell.

The first electrode and the second electrode, which are the electrodes of the first solar cell, are preferably light-transmissive electrodes. The light-transmissive electrode preferably includes one or more types of transparent conductive film selected from the group consisting of indium tin oxide (ITO), aluminum-doped zinc oxide (AZO), boron-doped zinc oxide (BZO), gallium-doped zinc oxide (GZO), indium-doped zinc oxide (IZO), aluminum gallium oxide (AGO), titanium-doped indium oxide (ITiO), indium gallium zinc oxide (IGZO), and hydrogen-doped indium oxide ($In_2O_3$). An electrode in which a tin oxide film or the like is laminated on these transparent conductive films is also preferable as an electrode of the first solar cell 11.

Second Solar Cell Module

The second solar cell module 20 includes a plurality of second solar cells 21. The second solar cell module 20 receives the light passing through the first solar cell module 10 to generate electric power.

In the second solar cell 21 of the second solar cell module 20, the first electrode, the light-absorbing layer, and the second electrode are disposed in order from the light incident side. An intermediate layer not specified may be included between these layers. The plurality of second solar cells 21 are physically disposed in parallel with the same electrical polarity.

The plurality of second solar cells 21 are electrically connected by the second connection wiring. The plurality of second solar cells 21 are electrically connected in series, in parallel, or in series and parallel. For example, in the second solar cell 21, when the first electrode and the second electrode of the adjacent second solar cells 21 are electrically connected and thus the second solar cells 21 are electrically connected in series, the first electrode and the second electrode or the first electrode can constitute the second connection wiring. When the first electrodes of the adjacent second solar cells 21 are electrically connected and thus the second solar cells 21 are electrically connected in parallel, the first electrodes can constitute the second connection wiring. When the adjacent second solar cells 21 are electrically connected to each other by a conductive layer other than the first electrode and the second electrode, this conductive layer can constitute the second connection wiring. In the embodiment, the second connection wiring is a conductive member included in the outermost periphery of the conductive members included in the second solar cell 21. The second connection wiring of the second solar cell 21 is disposed at a position closest to the first connection wiring of the first solar cell 11. Another conductive layer includes, for instance, a bus bar.

The band gap of the light-absorbing layer of the second solar cell 21 is preferably narrower than the band gap of the light-absorbing layer of the first solar cell 11. The light-absorbing layer of the second solar cell 21 preferably has a narrow band gap. Specifically, the band of the second solar cell 21 is preferably 1.0 eV or more and 1.4 eV or less.

The light-absorbing layer of the second solar cell 21 is not particularly limited as long as it satisfies the band gap described above. Specifically, the light-absorbing layer of the second solar cell 21 includes one type selected from the group consisting of a crystalline Si layer, a semiconductor film having a chalcopyrite structure, and a CdTe film. Examples of the semiconductor film having a chalcopyrite structure include $Cu(In, Ga)(Se, S)_2$, $Cu(In, Ga)Se_2$, $Cu(In, Ga)S_2$, and $CuInTe_2$.

The n-type layer of the second solar cell 21 includes a p-type layer and an n-type layer. The first solar cell 11 may be a homojunction solar cell or a heterojunction solar cell.

As the first electrode of the second solar cell 21, for example, a light-transmissive electrode or a linear electrode, or an electrode formed by stacking a metal foil or a metal ribbon serving as a bus bar on a ladder-like electrode or a chain-like electrode is used. As the second electrode of the second solar cell 21, a light-transmissive electrode is preferable. The light-transmissive electrode preferably includes one or more types of transparent conductive film selected from the group consisting of indium tin oxide (ITO), aluminum-doped zinc oxide (AZO), boron-doped zinc oxide (BZO), gallium-doped zinc oxide (GZO), indium-doped zinc oxide (IZO), aluminum gallium oxide (AGO), titanium-doped indium oxide (ITiO), indium gallium zinc oxide (IGZO), and hydrogen-doped indium oxide ($In_2O_3$). An electrode in which a tin oxide film or the like is laminated on these transparent conductive films is also preferable as an electrode of the first solar cell 11.

Adhesive Layer

The adhesive layer 30 bonds the first solar cell module 10 and the second solar cell module 20. The adhesive layer 30 is disposed between the first solar cell module 10 and the insulation film 40. The surface of the adhesive layer 30 facing the first solar cell module 10 is in direct contact with the surface of the first solar cell module 10 facing the adhesive layer 30. Preferably, the entire surface of the adhesive layer 30 facing the first solar cell module 10 is in direct contact with the entire surface of the first solar cell module 10 facing the adhesive layer 30. The surface of the adhesive layer 30 facing the insulation film 40 (surface facing the second solar cell module 20) is in direct contact with the surface of the insulation film 40 facing the adhesive layer 30.

The adhesive layer 30 is preferably a resin layer with a relatively low melting point. If the melting point is too high, the temperature applied when bonding the first solar cell module 10 and the second solar cell module 20 to each other after melting becomes too high, which is not preferable because the solar cell is liable to be broken.

The melting point of the adhesive layer 30 is preferably 150° C. or more. If the melting point of the adhesive layer 30 is less than 150° C., the adhesive layer is liable to melt during operation of the solar cell module 100. The melting point of the adhesive layer 30 is preferably 300° C. or less. If the melting point of the adhesive layer 30 is higher than 300° C., the adhesive layer 30 needs to be heated to a high temperature when bonding the first solar cell module 10 and the second solar cell module 20 together, and it is not preferable because the solar cell is liable to be broken.

The adhesive layer 30 is preferably a resin sheet. A specific material used for the adhesive layer 30 is preferably one or more types selected from the group consisting of an ethylene vinyl acetate copolymer resin sheet (EVA sheet), a polyvinyl butyral resin sheet (PVB Sheet), and a polyolefin resin sheet.

Insulation Film

The insulation film 40 is disposed between the adhesive layer 30 and the second solar cell module 20, and is provided on a surface of the second connection wiring facing the adhesive layer 30. Preferably, one surface of the insulation film 40 is in direct contact with the surface of the adhesive layer 30 facing the second solar cell module 20, and the surface opposite to the one surface of the insulation film 40 is in direct contact with the surface of the second connection wiring facing the adhesive layer 30. The insulation film 40 is an insulation member disposed so that the second connection wiring and the adhesive layer 30 are not in direct contact with each other. The material used for the adhesive layer 30 is liable to decompose when used in an environment such as long-term sunlight irradiation, high temperature, and high humidity. If the insulation film 40 is not used, when the adhesive layer 30 is decomposed, the first connection wiring and the second connection wiring become liable to short-circuit. The first solar cell 11 and the second solar cell 21 are not easily to be short-circuit by using of a material less liable to decompose for the insulation film 40 even if the adhesive layer 30 is decomposed.

Preferably, the insulation film 40 is further in direct contact with at least a part of the side surface of the surface of the second connection wiring facing the adhesive layer 30, from the viewpoint of protecting the second connection wiring.

The melting point of the insulation film 40 is preferably 200° C. or more. If the melting point of the insulation film 40 is low, it is not preferable because the insulation film 40 is liable to melt at the time of bonding by the adhesive layer 30. From the same viewpoint, the melting point of the insulation film 40 is preferably 50° C. or more higher than the melting point of the adhesive layer 30.

The insulation film 40 preferably includes one or more types selected from the group consisting of a resin, a metal oxide, and a metal nitride. These materials are preferable because they satisfy the requirements of the insulation film 40. Since the insulation film 40 may cover the second connection wiring, it may not cover the entire surface of the second solar cell module 20.

The insulation film 40 is preferably one or more types of film selected from the group consisting of a polyimide film, a glass tape, a quartz tape, a polyamide film, an epoxy resin sheet, and a polyester sheet, or a film of metal oxide or metal nitride including one or more types of metal selected from the group consisting of Si, Al, Ca, Mg, Ga, and Ge. As a specific film of metal oxide or metal nitride including one or more types of metal selected from the group consisting of Si, Al, Ca, Mg, Ga, and Ge, one or more types selected from the group consisting of $SiO_x$, $SiN_x$, $AlO_x$, $CaO_x$, $MgO_x$, $GaO_x$, and $GeO_x$ are preferable. The metal oxide and metal nitride preferably satisfy $0.0<X\leq2.5$.

The one or more types of film selected from the group consisting of a polyimide film, a glass tape, a quartz tape, a polyamide film, an epoxy resin sheet, and a polyester sheet are disposed on the second solar cell module 20. The film of metal oxide or metal nitride including one or more types of metal selected from the group consisting of Si, Al, Ca, Mg, Ga, and Ge are preferably formed on the second connection wiring by sputtering or evaporation.

Figure 2:
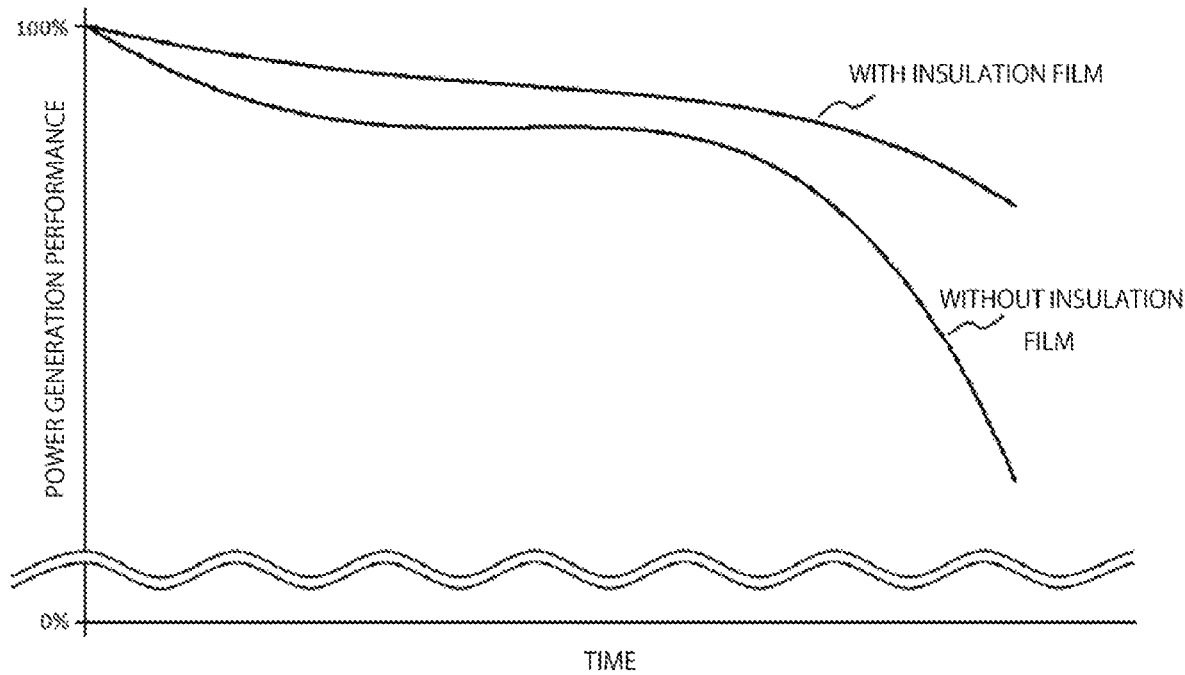
FIG. 2 shows an evaluation result of a solar cell module.

Here, an evaluation result of the solar cell module with or without the insulation film 40 is shown. A multi-junction solar cell module in which an EVA sheet as the adhesive layer 30 and a polyimide film as the insulation film 40 were provided between the first solar cell module 10 and the second solar cell module 20 was evaluated. In order to evaluate the insulation film 40, a module not using the insulation film 40 was also evaluated. Power generation was performed by the solar cell module at a temperature of 85° C. and a humidity of 85% for several thousand hours, and the reduction rate in output was measured. FIG. 2 shows the power reduction rate of the second solar cell module 20 in the module with and without the polyimide film. A Cu bus bar corroded by acetic acid generated when the EVA sheet was hydrolyzed was used for the second connection wiring. By combining the EVA sheet with the Cu wiring, the influence of the hydrolysis of the EVA sheet can be evaluated from the corrosion of the Cu bus bar.

Reduction in conversion efficiency is small in a case of using the polyimide film, whereas reduction in conversion efficiency is large in a case of not using the polyimide film. An EL (electroluminescence) test has shown that in the case of not using the polyimide film, the Cu bus bar as the second connection wiring is corroded from the middle, and the EVA sheet used for the adhesive layer 30 is hydrolyzed. Furthermore, as time elapses, corrosion of the Cu bus bar develops. In a case of using the polyimide film, on the other hand, since the Cu bus bar is protected by the polyimide film, the Cu bus bar is not corroded, and the first solar cell 11 and the second solar cell 21 do not short-circuit.

Next, a multi-junction solar cell module will be specifically explained by exemplifying a multi-junction solar cell module 101 in which a compound semiconductor layer having a chalcopyrite structure such as $CuGaSe_2$ is used as the light-absorbing layer of the first solar cell module 10 and a crystal Si is used as the light-absorbing layer of the second solar cell module 20.

Figure 3:
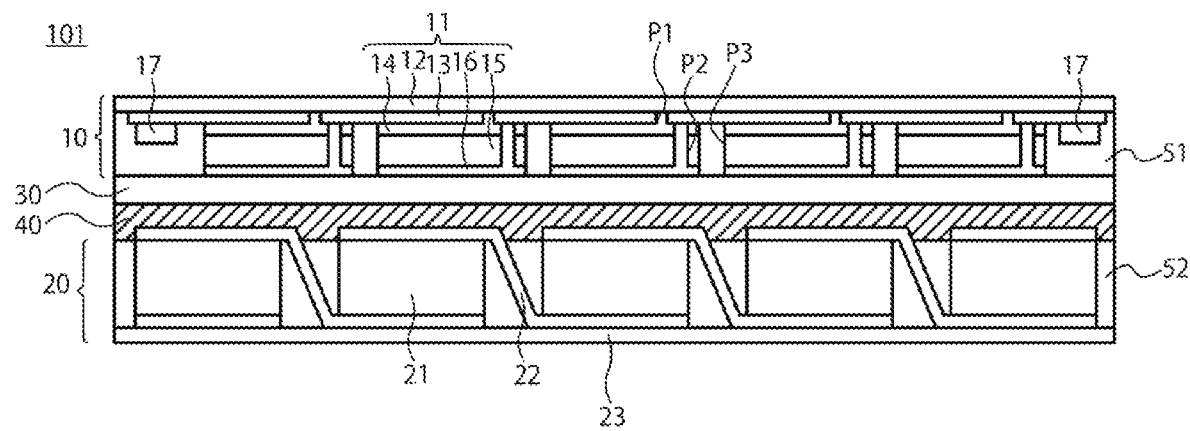
FIG. 3 shows a sectional view of the multi-junction solar cell module.

FIG. 3 shows a sectional view of the multi-junction solar cell module 101. The multi-junction solar cell module 101 shown in FIG. 3 has the first solar cell module 10 (top cell), the second solar cell module 20 (bottom cell), the adhesive layer 30, and the insulation film 40. The gap between the first solar cell module 10 and the second solar cell module 20 is preferably filled with fillers 51 and 52 such as an epoxy resin, for example. The insulation film 40 is a belt-like sheet disposed along a bus bar 22.

The first solar cell 11 has a substrate 12, a first electrode 13, an n-type layer 14, a light-absorbing layer 15, and a second electrode 16. The light-absorbing layer 15 may be disposed more on the light incident side than the n-type layer 14. In the first solar cell module 10, the first solar cells 11 are electrically connected in series by the second electrode 16. Accordingly, in the multi-junction solar cell module 101, the second electrode 16 of the first solar cell 11 serves as the first connection wiring. The first solar cells 11 at both ends are each connected with a bus bar 17. The electric power generated at the first solar cell module 10 is output via the bus bar 17. The first solar cell module 10 is scribed P1, P2, and P3, and the adjacent first solar cells 11 are connected with the first electrode 13 on the upper side and the second electrode 16 on the lower side.

The second solar cell module 20 has the second solar cell 21, the bus bar 22, and a protective layer 23. The second solar cells 21 are electrically connected in series with the three bus bars 22. The bus bar 22 is connected with the front side (first solar cell module 10 side) of one of the adjacent second solar cells 21 and is connected with the rear side (opposite side of the first solar cell module 10) of the other second solar cell 21. Accordingly, the bus bar 22 serves as the second connection wiring. The electric power generated at the second solar cell module 20 is output via the bus bars 22 at both ends. As shown in FIG. 3, the bus bar 22 may be partially embedded in the insulation film 40. When the bus bar 22 is embedded in the insulation film 40, the side surface of the bus bar 22 is also in direct contact with the insulation film 40, and hence the insulation property between the bus bar 22 and the first solar cell 11 is further improved. The protective layer 23 is a layer so-called back sheet and is, for instance, an EVA sheet.

The first solar cell module 10 and the second solar cell module 20 sandwich the adhesive layer 30 and the insulation film 40 between them. The surface of the adhesive layer 30 facing the second solar cell module 20 is in direct contact with the insulation film 40 and the portion of the second solar cell module 20 except the second connection wiring, and the surface facing the first solar cell module 10 is in direct contact with the first solar cell module 10. The insulation film 40 and a part of the bus bar 22 are embedded in the adhesive layer 30.

Figure 4:
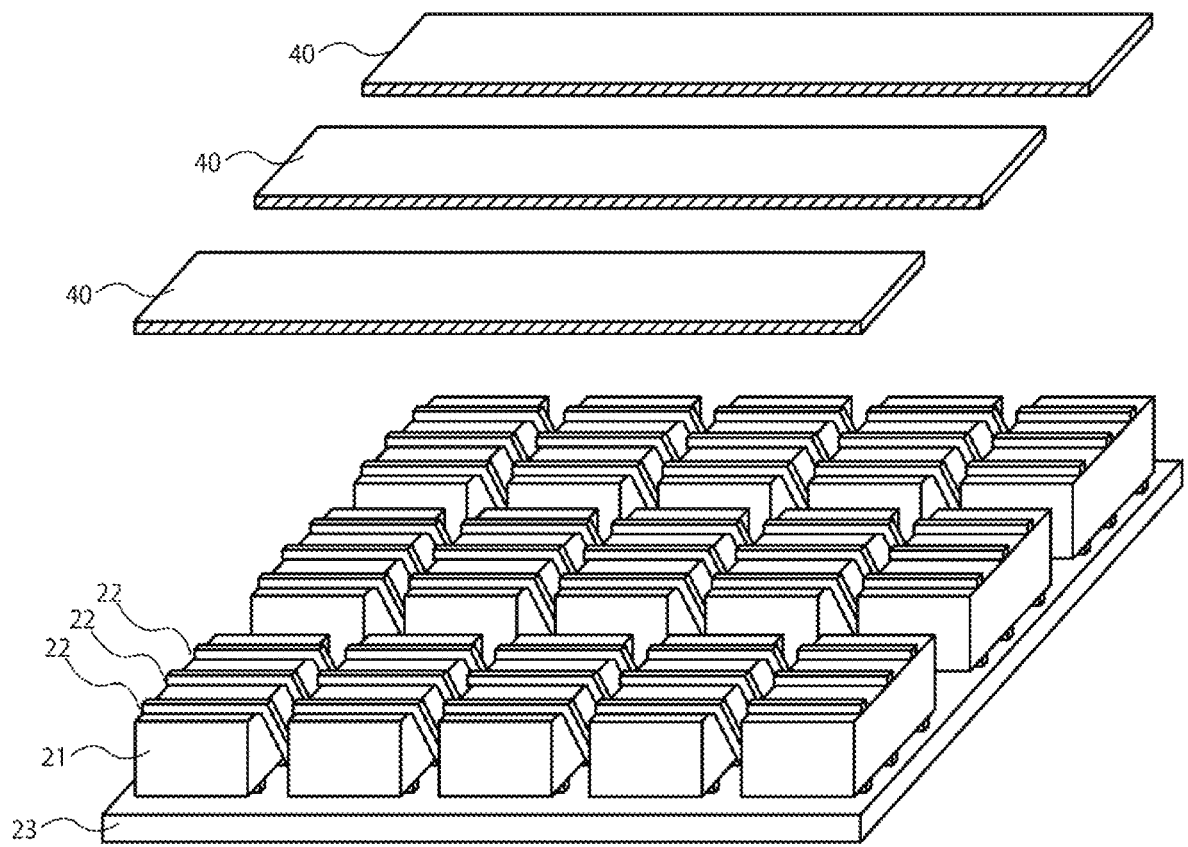
FIG. 4 shows a perspective process drawing of the multi-junction solar cell module.

The multi-junction solar cell module 101 will be described in more detail with reference to the perspective process drawings of FIGS. 4 and 5. FIG. 4 shows the process of overlapping the insulation film 40 on the second solar cell module 20. Since there are three rows of sets of three bus bars 22, there are three portions of the insulation film 40. The insulation film 40 and the second solar cell module 20 are overlapped so that the insulation film 40 covers the bus bar 22. Fillers are not shown in FIGS. 4 and 5.

Figure 5:
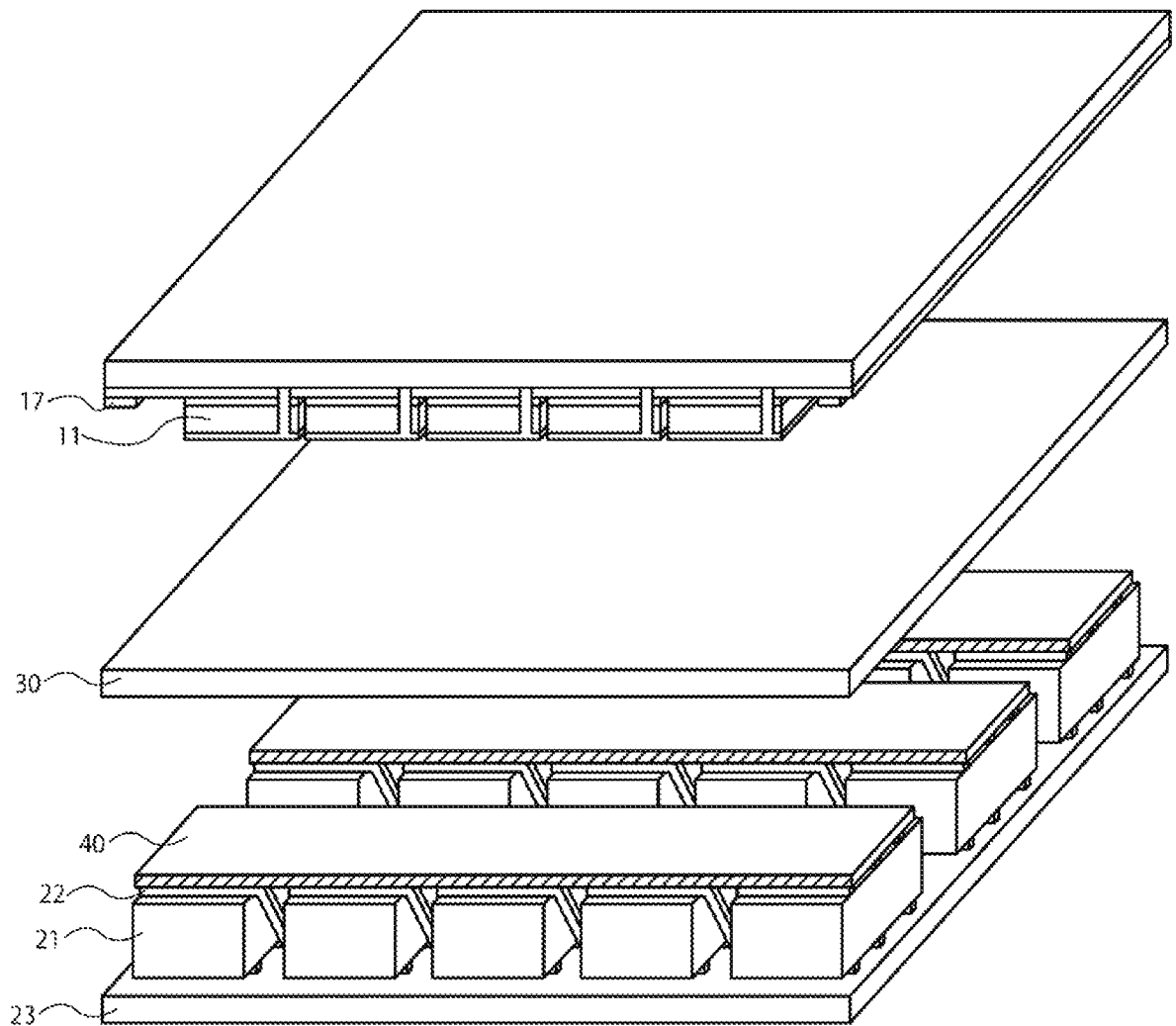
FIG. 5 shows a perspective process drawing of the multi-junction solar cell module.
Figure 6:
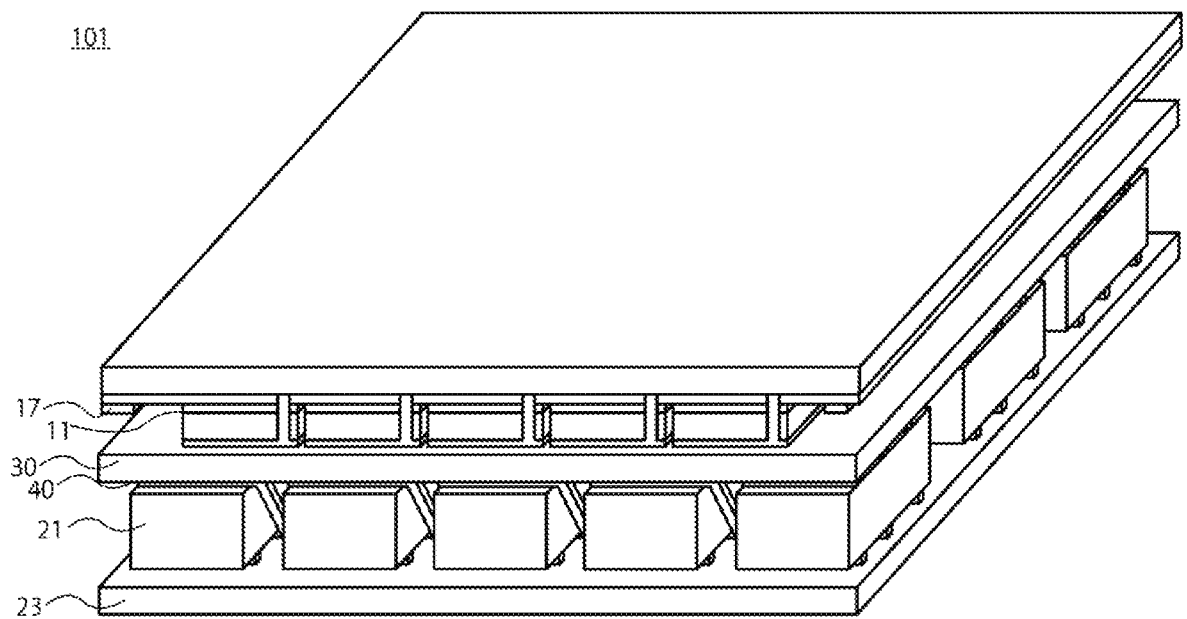
FIG. 6 shows a perspective process drawing of the multi-junction solar cell module.

FIG. 5 shows a process of bonding the second solar cell module 20, on which the insulation film 40 is overlapped, and the first solar cell module 10 with the adhesive layer 30. When the second solar cell module 20, on which the insulation film 40 is overlapped, and the first solar cell module 10 are bonded by the adhesive layer 30, the adhesive layer 30 is melted by heating corresponding to the melting point of the adhesive layer 30. Then, as shown in the perspective view of FIG. 6, the multi-junction solar cell module 101 in which the first solar cell module 10 and the second solar cell module 20 are joined by the adhesive layer 30 and the insulation film 40 is obtained. The second solar cell module 20 side of the adhesive layer 30 is in direct contact with both the second solar cell module 20 and the bus bar 22.

Without the insulation film 40, only the adhesive layer 30 is present between the first connection wiring and the second connection wiring, and hence there is a possibility that the first connection wiring and the second connection wiring short-circuit when the adhesive layer 30 deteriorates as described above. However, providing the insulation film 40 can reduce the possibility of short-circuit between the wirings. Even if a Cu bus bar is used for the bus bar 22 of the second solar cell module 20 and EVA is used for the adhesive layer 30, the insulation film 40 protects the Cu bus bar, so that the possibility of corrosion of the bus bar 22 can be reduced. Even if another metal material such as aluminum or aluminum alloy is used in addition to Cu, corrosion of the metal can be prevented by using the adhesive layer 30 and the insulation film 40 in combination.

Next, a multi-junction solar cell module will be specifically explained by exemplifying a multi-junction solar cell module 102 in which a compound semiconductor layer having a chalcopyrite structure such as $CuGaSe_2$ is used as the light-absorbing layer of the first solar cell module 10 and a compound semiconductor layer having a chalcopyrite structure such as $Cu(In, Ga)Se_2$ is used as the light-absorbing layer of the second solar cell module 20.

Figure 7:
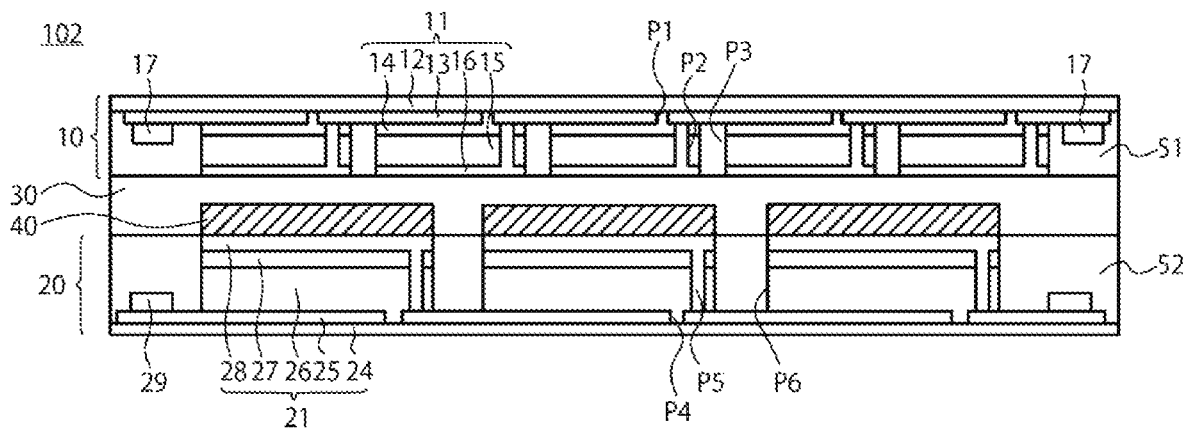
FIG. 7 shows a sectional view of the multi-junction solar cell module.

FIG. 7 shows a sectional view of the multi-junction solar cell module 102. The multi-junction solar cell module 102 of FIG. 7 is a variation of the multi-junction solar cell module 101 of FIG. 4. The multi-junction solar cell module 102 shown in FIG. 7 has the first solar cell module 10, the second solar cell module 20, the adhesive layer 30, and the insulation film 40. The gap between the first solar cell module 10 and the second solar cell module 20 is preferably filled with fillers 51 and 52 such as an epoxy resin, for example. The first solar cell module 10 serving as the top cell of the multi-junction solar cell module 102 is the same as the first solar cell module 10 of the multi-junction solar cell module 101. The insulation film 40 is a belt-like sheet corresponding to the shape of a second electrode 28 of the second solar cell 21.

The second solar cell 21 has a substrate 24, a first electrode 25, a light-absorbing layer 26, an n-type layer 27, and a second electrode 28. In the second solar cell module 20, the second solar cells 21 are electrically connected in series by the second electrode 28. Accordingly, in the multi-junction solar cell module 102, the second electrode 28 of the second solar cell 21 serves as the second connection wiring. The second solar cells 21 at both ends are each connected with a bus bar 29. The electric power generated at the second solar cell module 20 is output via the bus bar 29. The second solar cell module 20 is scribed P4, P5, and P6, and the adjacent second solar cells 21 are connected with the first electrode 25 on the upper side and the second electrode 28 on the lower side.

The first solar cell module 10 and the second solar cell module 20 sandwich the adhesive layer 30 and the insulation film 40 between them. The surface of the adhesive layer 30 facing the second solar cell module 20 is in direct contact with the insulation film 40 and the portion of the second solar cell module 20 except the second connection wiring, and the surface facing the first solar cell module 10 is in direct contact with the first solar cell module 10. The insulation film 40 is embedded in the adhesive layer 30.

Figure 8:
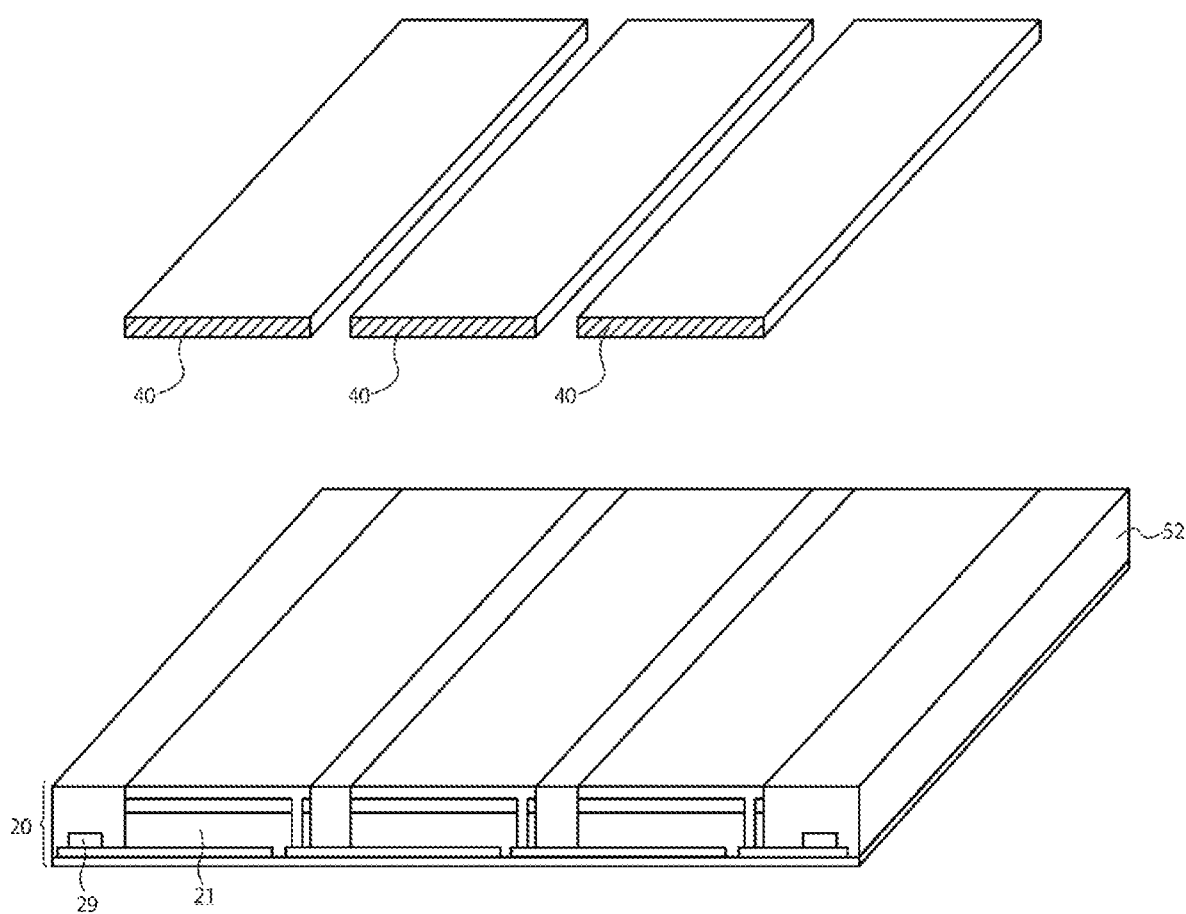
FIG. 8 shows a perspective process drawing of the multi-junction solar cell module.

The multi-junction solar cell module 102 will be described in more detail with reference to the perspective process drawings of FIGS. 8 and 9. FIG. 8 shows the process of overlapping the insulation film 40 on the second solar cell module 20. Since there are three rows of second solar cells, there are three portions of the insulation film 40. The insulation film 40 may be a single sheet. The insulation film 40 and the second solar cell module 20 are overlapped so that the insulation film 40 covers the bus bar 22.

Figure 9:
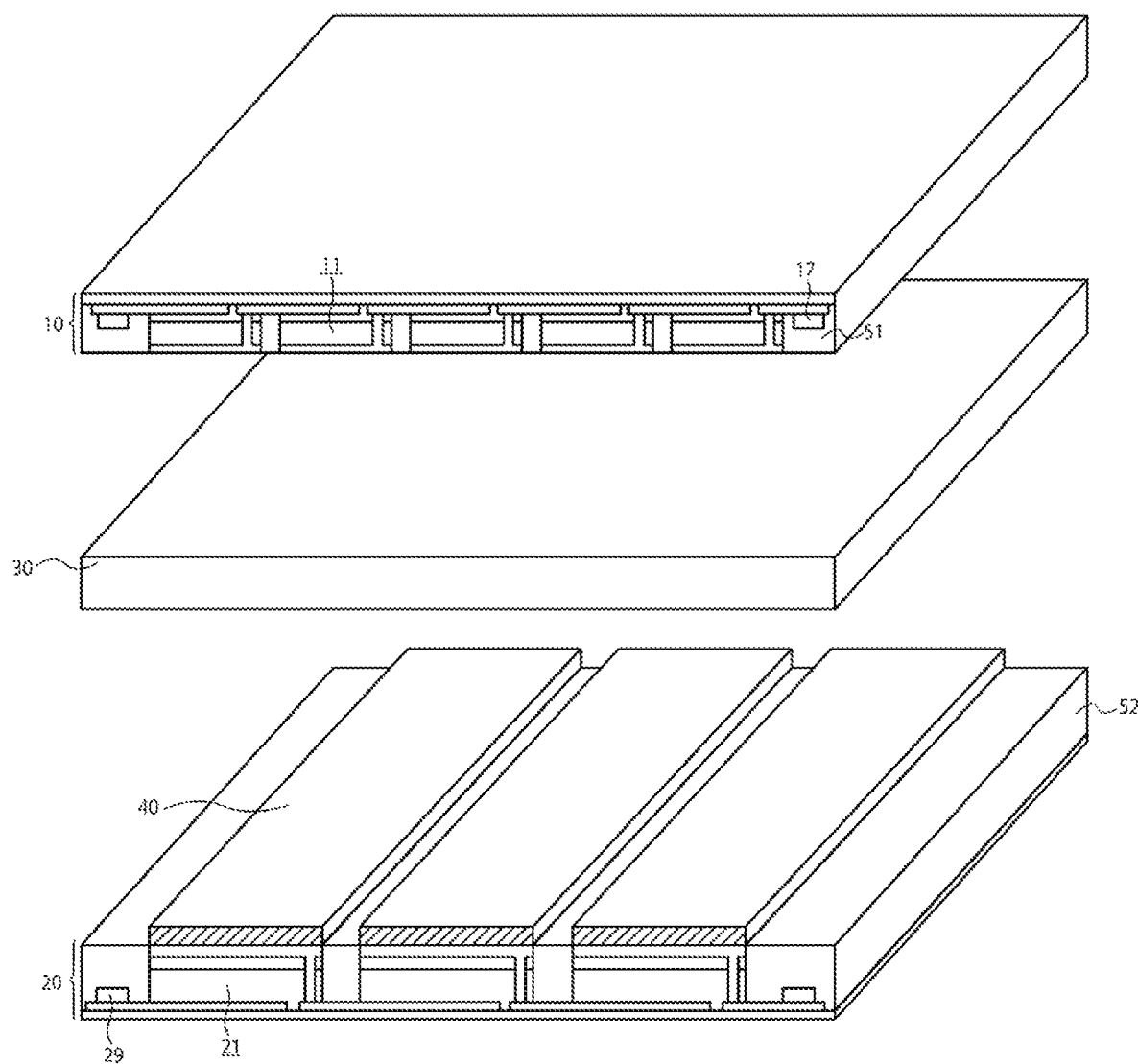
FIG. 9 shows a perspective process drawing of the multi-junction solar cell module.
Figure 10:
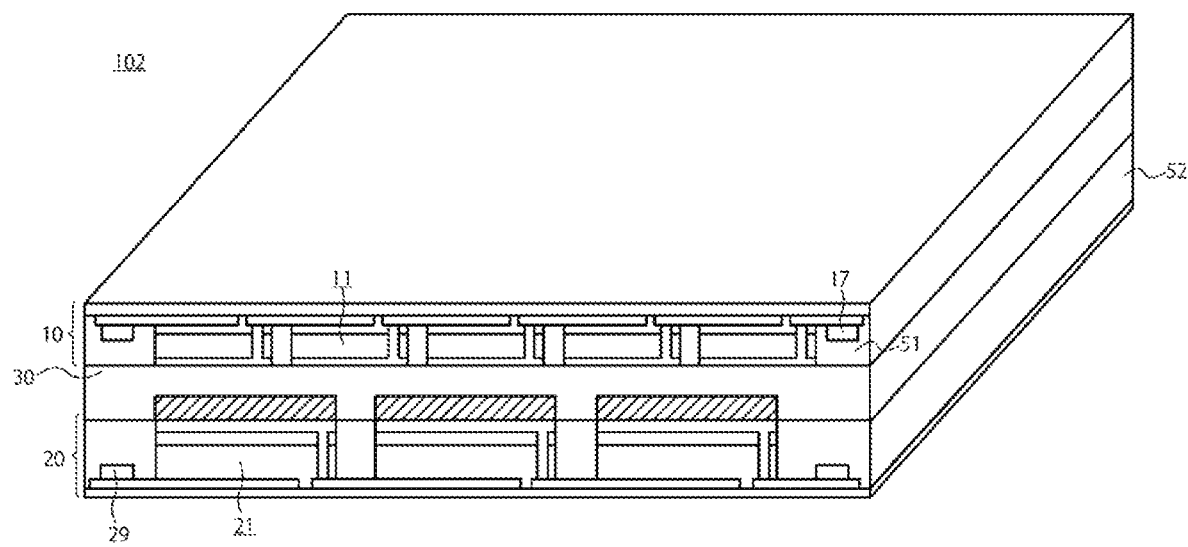
FIG. 10 shows a perspective process drawing of the multi-junction solar cell module.

FIG. 9 shows a process of bonding the second solar cell module 20, on which the insulation film 40 is overlapped, and the first solar cell module 10 with the adhesive layer 30. When the second solar cell module 20, on which the insulation film 40 is overlapped, and the first solar cell module 10 are bonded by the adhesive layer 30, the adhesive layer 30 is melted by heating corresponding to the melting point of the adhesive layer 30. Then, as shown in the perspective view of FIG. 10, the multi-junction solar cell module 102 in which the first solar cell module 10 and the second solar cell module 20 are joined by the adhesive layer 30 and the insulation film 40 is obtained. The second solar cell module 20 side of the adhesive layer 30 is in direct contact with both the second solar cell module 20 and the bus bar 22.

Figure 11:
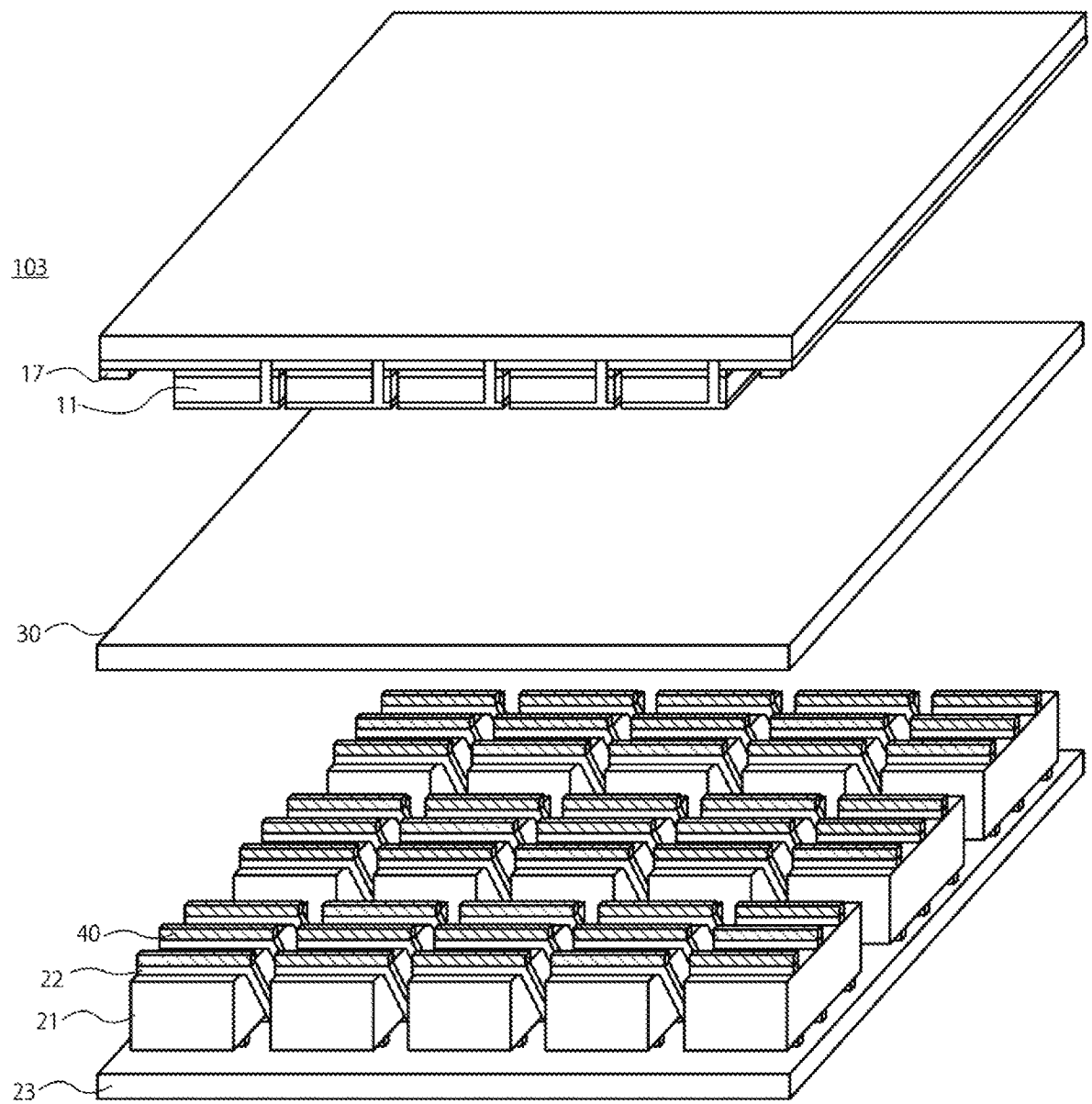
FIG. 11 shows a perspective developed view of the multi-junction solar cell module.

FIG. 11 shows a perspective development view of a multi-junction solar cell module 103. The multi-junction solar cell module 103 of FIG. 11 is a variation of the multi-junction solar cell module 101 of FIG. 4. The difference between the multi-junction solar cell module 101 of FIG. 4 and the multi-junction solar cell module 103 of FIG. 11 is that the insulation film 40 is not a sheet but a film of metal oxide or metal nitride formed by sputtering or evaporation.

Photovoltaic Power Generation System

Figure 12:
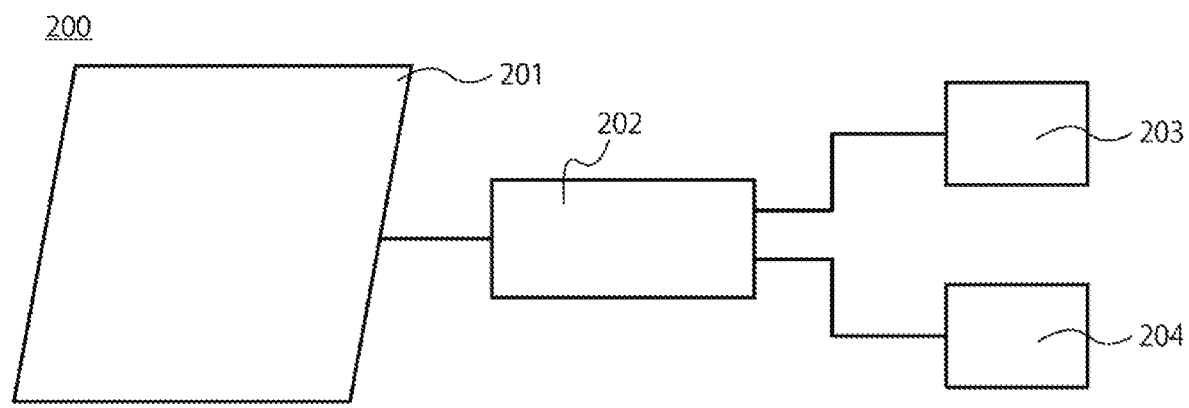
FIG. 12 shows a configuration concept diagram of a photovoltaic system.

An embodiment relates to a photovoltaic power generation system. The solar cell module of the embodiment can be used as a power generator that performs power generation in the photovoltaic power generation system of the embodiment. The photovoltaic power generation system of the embodiment performs power generation using a solar cell module, and specifically includes a solar cell module that performs power generation, a unit that performs power conversion of generated electricity, and an electricity accumulating unit that stores the generated electricity or a load that consumes the generated electricity. FIG. 12 shows a conceptual configuration diagram of a photovoltaic power generation system 200 of the embodiment. The photovoltaic power generation system of FIG. 12 includes a solar cell module 201, a converter 202, a storage battery 203, and a load 204. Either one of the storage battery 203 or the load 204 may be omitted. The load 204 may be configured to be able to utilize electric energy stored in the storage battery 203. The converter 202 is a device including a circuit or element that performs power conversion such as voltage transformation and DC/AC conversion, for example, a DC-DC converter, DC-AC converter, and AC-AC converter. A suitable configuration may be adopted for the converter 202 in accordance with a generated voltage, and configurations of the storage battery 203 and the load 204.

Each solar cells receive light and generate power, and the electric energy is converted by the converter 202 and stored in the storage battery 203 or consumed by the load 204. The solar cell module 201 is preferably provided with a sunlight tracking drive device for constantly directing the solar cell module 201 to the sun, a light collector for collecting sunlight, a device for improving power generation efficiency, and the like.

The photovoltaic power generation system 200 is preferably used for real estate such as a residence, a commercial facility, and a factory, and is used for a movable item such as a vehicle, an aircraft, and an electronic device. An increase in the amount of power generation is expected by using the photoelectric conversion element having excellent conversion efficiency of the embodiment, for the solar cell module 201.

Hereinafter, the present disclosure will be more specifically described based on examples, but the present disclosure is not limited to the following examples.

EXAMPLE 1

A multijunction solar cell is manufactured by using $CuGaSe_2$ for the light absorbing layer of the fist solar cell module 10, an EVA sheet for the adhesive film 30, a polyimide film for the insulation film 40, and crystal silicon for the light absorbing layer of the second solar cell module 20.

EXAMPLE 2

A multijunction solar cell is manufactured by using copper suboxide for the light absorbing layer of the fist solar cell module 10, an EVA sheet for the adhesive film 30, a polyimide film for the insulation film 40, and crystal silicon for the light absorbing layer of the second solar cell module 20.

EXAMPLE 3

A multijunction solar cell is manufactured by using $CuGaSe_2$ for the light absorbing layer of the fist solar cell module 10, a PVB sheet for the adhesive film 30, a glass tape for the insulation film 40, and crystal silicon for the light absorbing layer of the second solar cell module 20.

EXAMPLE 4

A multijunction solar cell is manufactured by using organic thin film for the light absorbing layer of the fist solar cell module 10, an EVA sheet for the adhesive film 30, an oxide film including Al formed by sputtering on the bus bar on the second solar cell for the insulation film 40, and crystal silicon for the light absorbing layer of the second solar cell module 20.

EXAMPLE 7

A multijunction solar cell is manufactured by using perovskite thin film for the light absorbing layer of the fist solar cell module 10, an EVA sheet for the adhesive film 30, an oxide film including Al formed by sputtering on the bus bar on the second solar cell for the insulation film 40, and crystal silicon for the light absorbing layer of the second solar cell module 20.

EXAMPLE 6

A multi-junction solar cell module is manufactured by using $Cu(In, Ga)(Se, S)_2$ having a low In ratio for the light-absorbing layer of the first solar cell module 10, an EVA sheet for the adhesive layer 30, a nitride film including Si formed on the second electrode on the second solar cell by sputtering for the insulation film 40, and Cu(In, Ga)(Se, S)$_2$ having a low In ratio for the light-absorbing layer of the second solar cell module 20.

EXAMPLE 7

A multijunction solar cell is manufactured by using CuGaSe$_2$ for the light absorbing layer of the fist solar cell module 10, an EVA sheet for the adhesive film 30, a quartz film for the insulation film 40, and crystal silicon for the light absorbing layer of the second solar cell module 20.

COMPARATIVE EXAMPLES 1 TO 7

Multi-junction solar cell modules are manufactured in the same manner as in Examples 1 to 7 without using the insulation film 40.

While there are no differences in the initial performance between the multi-junction solar cell modules of the examples and the corresponding comparative examples, the performance deterioration of the examples is less than that of the comparative examples by operating for a long time at a temperature of 85° C. and a humidity of 85%.

In the description, some elements are denoted only by element symbols.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A multi-junction solar cell module, comprising:
a first solar cell module disposed on a light incident side and including a plurality of first solar cells and a first connection wiring electrically connecting the plurality of the first solar cells;
a second solar cell module including a plurality of second solar cells and a second connection wiring electrically connecting the plurality of the second solar cells; and
an adhesive layer between the first solar cell module and the second solar cell module, wherein:
an insulation film is provided on a surface of the second connection wiring facing an adhesive layer so as to be in direct contact with a surface of the adhesive layer facing the second solar cell module;
the first solar cell module includes a substrate on a light incident side, and the substrate is a single substrate of the first solar cell module;
the second connection wiring is not in direct contact with the adhesive layer;
the insulation film is one or more types of film selected from a group consisting of a polyimide film, a glass tape, a quartz tape, a polyamide film, an epoxy resin sheet, and a polyester sheet, or a film of metal oxide or metal nitride;
the metal oxide included one or more types of metal selected from a group consisting of Al, Ca, Mg, Ga, and Ge;
the metal nitride includes one or more types of metal selected from a group consisting of Si, Al, Ca, Mg, Ga, and Ge,
the first connection wiring is in direct contact with the adhesive layer, and
the adhesive layer is an ethylene vinyl acetate copolymer resin sheet, a polyvinyl butyral resin sheet, or a polyolefin resin sheet.

2. The module according to claim 1, wherein a melting point of the adhesive layer is lower than a melting point of the insulation film.

3. The module according to claim 1, wherein a melting point of the adhesive layer is 150° C. or more.

4. The module according to claim 1, wherein a melting point of the insulation film is 200° C. or more.

5. The module according to claim 1, wherein a melting point of the insulation film is 50° C. or more higher than a melting point of the adhesive layer.

6. The module according to claim 1, wherein a band gap of a light-absorbing layer of the plurality of the first solar cells is wider than a band gap of a light-absorbing layer of the plurality of the second solar cells.

7. The module according to claim 1, wherein the film of metal oxide or metal nitride including one or more types of metal selected from a group consisting of Ca, Mg, Ga, and Ge.

8. A photovoltaic system using the multi-junction solar cell module according to claim 1.

9. The module according to claim 1, wherein the insulation film is one or more types of film selected from a group consisting of the polyimide film, the glass tape, the quartz tape, the polyamide film, the epoxy resin sheet, and the polyester sheet, or the film of metal nitride.

10. The module according to claim 1, wherein the insulation film is one or more types of film selected from a group consisting of the polyimide film, the glass tape, the quartz tape, the polyamide film, the epoxy resin sheet, and the polyester sheet, or the film of metal oxide.

11. The module according to claim 1, wherein the insulation film is one or more types of film selected from a group consisting of the polyimide film, the glass tape, the quartz tape, the polyamide film, the epoxy resin sheet, and the polyester sheet.

12. The module according to claim 1, wherein the first solar cell module, the adhesive layer, the insulation film, and the second solar cell module are stacked in this order.

13. The module according to claim 1, wherein the first solar cell is in direct contact with the adhesive layer, and the adhesive layer is in direct contact with the insulation film.

14. The module according to claim 1, wherein a part of the second connection wiring is contacted with the insulation layer.

15. The module according to claim 1, wherein the first wiring and the second wiring are not short-circuited.

16. The module according to claim 1, wherein the plurality of the first solar cells and the plurality of the second solar cells are not short-circuited.

17. The module according to claim 1, wherein the adhesive layer is the ethylene vinyl acetate copolymer resin sheet or the polyvinyl butyral resin sheet.

18. The module according to claim 1, wherein the adhesive layer and the insulating film are stacked.

* * * * *